United States Patent [19]

Watanabe et al.

[11] Patent Number: 4,881,203
[45] Date of Patent: Nov. 14, 1989

[54] SEMICONDUCTOR MEMORY DEVICE

[75] Inventors: Kazuo Watanabe; Akira Yumoto, both of Kanagawa, Japan

[73] Assignee: Sony Corporation, Tokyo, Japan

[21] Appl. No.: 168,511

[22] Filed: Mar. 15, 1988

[30] Foreign Application Priority Data

Mar. 17, 1987 [JP] Japan ................. 62-63340

[51] Int. Cl.$^4$ ............................. G11C 7/00
[52] U.S. Cl. ....................... 365/203; 365/230.03; 365/190
[58] Field of Search ............. 365/189, 203, 230, 233, 365/230.03, 190, 154

[56] References Cited

U.S. PATENT DOCUMENTS

| | | | |
|---|---|---|---|
| 4,596,001 | 6/1986 | Baba | 365/189 |
| 4,722,074 | 1/1988 | Fujishima et al. | 365/203 |
| 4,754,433 | 6/1988 | Chin et al. | 365/189 |

Primary Examiner—Joseph A. Popek
Attorney, Agent, or Firm—Hill, Van Santen, Steadman & Simpson

[57] ABSTRACT

A semiconductor memory device wherein a group of multiple memory cells is divided into a plurality of memory cell blocks, and the output of each memory cell block is connected to a main data line. This memory device is adapted for increasing the data read speed.

9 Claims, 4 Drawing Sheets

SEMICONDUCTOR MEMORY DEVICE

BACKGROUND OF THE INVENTION

1. Field of the Invention

The present invention relates to a semiconductor memory device and, more particularly, to a memory device wherein a group of multiple memory cells is divided into a plurality of memory cell blocks, and the output of each memory cell block is connected to a main data line.

2. Description of the Prior Art

The conventional large-capacity static RAMs having, for example, a capacity of 256 kilobits are mostly composed of 512 rows and 512 columns. However, due to the necessity of shortening the bit lines to achieve a higher speed, there is noted a recent trend toward increasing the number of columns such as, for example, to 256 rows and 1024 columns. As a result of such numerical increase of columns, the number of memory cells selectable by a single word line is also increased to consequently bring about an increase of the current consumption. In order to solve this problem, there has been appearing another new trend toward reducing the number of memory cells selectable by a single word line.

FIG. 4 is a layout diagram showing such an exemplary static RAM 1a. Denoted by 2 is a memory cell group which consists of memory cells arrayed to form 256 rows and 1024 columns. The memory cell group 2 is divided into a plurality of memory cell blocks $2_1$–$2_8$ (8 blocks in this example, but the number may be 16 or 4 without being limited to 8 alone), and each of such memory cell blocks $2_1$–$2_8$ consists of memory cells in an array of 256 rows and 128 columns so that 128 memory cells are selectable by a single word line.

Sense amp blocks SA1, SA2, .... SA8 are disposed adjacent to the memory cell blocks $2_1$, $2_2$, .... $2_8$, and the data read out from the memory cell via a pair of bit lines is fed to a local data line via a MOS FET controlled by a column select signal. The signal thus obtained from the local data line is amplified by the sense amp blocks SA1, SA2, .... SA8. Denoted by BS1, BS2, .... BS8 are block select blocks which are disposed adjacent to the sense amp blocks SA1, SA2, .... SA8 and serve to pass the output signal of the sense amp block SA therethrough in response to a block select signal. The entire output terminals of the block select blocks BS1, BS2, .... BS8 are connected to a main data line 4.

There are also shown a data hold circuit 5a for holding the data signal transferred thereto via the main data line 4, an output buffer circuit 6, and an output terminal 7.

FIG. 5 is a specific circuit diagram of a conventional exemplary memory device having the layout of FIG. 4.

There is shown in FIG. 5 a memory cell 8 connected to a power supply terminal (+Vcc) via MOS FETs M1, M2; a pair of bit lines B, $\overline{B}$ connected to the memory cell 8 and also to the terminal (+Vcc) in the same manner; and an equalizing MOS FET M3 connected between a pair of bit lines B, $\overline{B}$ and serving to short-circuit the bit lines B, $\overline{B}$ in response to an equalizing signal $\overline{\phi E}$.

A pair of local data lines 9, $\overline{9}$ are connected to the bit lines B, $\overline{B}$ via MOS FETs M4, M5. In response to a column select signal, the MOS FETs M4, M5 serve to connect the local data lines the bit lines B, $\overline{B}$. A MOS FET M6 functions to equalize between the local data lines 9, $\overline{9}$ and is controlled by an equalizing signal $\phi E$ in the same manner as the MOS FET M3. The signal read out via the local data lines 9, $\overline{9}$ amplified by the sense amp block SA. The sense amp block SA consists of three differential amplifiers A1, A2, A3 and an equalizing MOS FET M7. The output signal of the sense amp block SA is transferred via the block select block BS to the main data line 4. The block select block BS comprises a switch circuit consisting of a parallel connection of an N-channel MOS FET M8 and a P-channel MOS FET M9, a NAND circuit NA1 supplied with an equalizing signal $\overline{\phi E}$ and a block select signal BS, and an inverter I1 for inverting the output signal of the NAND circuit NA1. The above switch circuit is held in its on-state except for the period of equalization with the block selection being effected.

An output buffer control circuit 5a comprises a NOR circuit NR1, a NAND circuit NA2 and inverters I2, I3, I4. The data signal from the main data line 4 is fed to one input terminal of the NOR circuit NR1 while an output-disable signal OD is fed to the other terminal thereof, and an output signal of the NOR circuit NR1 is transferred to the inverter I3. The data signal from the main data line 4 is fed also to one input terminal of the NAND circuit NA2 while a signal obtained by inverting the output disable signal OD through the inverter I2 is fed to the other input terminal thereof, and the output signal of the NAND circuit NA2 is transferred to the inverter I4.

An output buffer circuit 6 comprises a P-channel MOS FET M10 and an N-channel MOS FET M11. The output signal of the inverter I3 is fed to the gate of the MOS FET M10 while the output signal of the inverter I4 is fed to the gate of the MOS FET M11, and the junction of the MOS FETs M10 and M11 is connected to the output terminal 7.

In the memory device of the arrangement of FIG. 4, the bit lines can be shortened with reduction of the number of memory cells selectable by a single word line. However, since the main data line 4 is rendered correspondingly longer, it has been difficult to attain a sufficiently high speed by using this technique.

In view of the above problem, an improved technique has been contrived with additional provision of a precharge circuit. This precharge circuit is driven by a pulse (equalizing signal) produced on the basis of the output signal of an ATD (address transition detector), whereby the main data line is precharged to a half potential of the supply voltage Vcc FIG. 6 (A) shows an example of such precharge circuit, and FIG. 6 (B) is a timing chart thereof. There are shown an inverter I5 for inverting the data signal read out from the memory cell and amplified by the sense amplifier, and a switch circuit SW1 controlled by a pulse $\phi 1$ and serving to short-circuit the input and output of the inverter I5. The inverter I5 has a CMOS configuration comprising a P-channel MOS FET and an N-channel MOS FET, and is so designed as to generate a half output voltage of the supply voltage Vcc when its input and output are short-circuited by the switch circuit SW1. The output signal from the inverter I5 is transferred to a latch circuit 10 via a switch circuit SW2.

In the operation of the precharge circuit, both pulses $\phi 1$ and $\phi 2$ rise simultaneously, to turn on the switch circuit SW1, thereby short-circuiting the input and output of the inverter I5 while turning on the switch circuit SW2, to electrically connect the main data line 4 to the output terminal of the inverter I5. Accordingly, the main data line 4 is precharged to a half potential of the supply voltage Vcc by the action of the inverter I5. And after the lapse of a predetermined time required for the precharge, the pulse φ1 falls, to turn off the switch circuit SW1, and then the latch pulse LP rises. However, the pulse φ2 still remains high, and the data signal is latched by the latch circuit 10 in the state where the pulse φ1 is "low", the pulse φ2 is "high" and the latch pulse LP is "high".

Since the main data line is thus precharged by the precharge circuit, transition of the data signal on the data line can be expedited to consequently increase the read speed.

Meanwhile in the conventional example of FIG. 5, where the main data line 4 is not precharged, it is impossible to eliminate the limit that exists in enhancing the rapidity due to the lengthened main data line 4 as mentioned previously.

The desired rapidity can be attained by adding the precharge circuit shown in FIG. 6. However, because of the precharge circuit configuration where the inverter I5, the switch circuit SW2 and the latch circuit 10 are inserted in the data signal transmission path, it follows that the data signal is transmitted to the output side via the inverter I5, the switch circuit SW2 and the latch circuit 10. Consequently there occurs a transmission delay of the data signal as a natural result. Therefore, even though the rapidity can be enhanced by such precharge, the delay caused by the signal passage through the inverter I5 and the switch circuit 10 needs to be subtracted, so that the rapidity fails to be effectively improved.

In addition, due to the necessity of producing particular pulses such as pulses φ1, φ2 and the latch pulse LP, circuits for generation of such pulses are required in particular to consequently render the circuit configuration more complicated.

SUMMARY OF THE INVENTION

In a semiconductor memory device wherein a group of multiple memory cells is divided into a plurality of memory cell blocks and the output of each memory cell block is connected to a main data line, the present invention is equipped with a precharge circuit for the purpose of effectively increasing the read speed without complicating the circuit configuration, wherein the precharge circuit is capable of outputting, synchronously with an equalizing signal, a medium-level voltage which is intermediate between a high level and a low level of the main data line, and the output of such precharge circuit is connected in parallel to the main data line.

BRIEF DESCRIPTION OF THE DRAWINGS

FIGS. 1 through 3 show an exemplary embodiment representing the semiconductor memory device of the present invention, in which FIG. 1 is a circuit diagram, FIG. 2 is a layout diagram of the memory device, and FIG. 3 is a timing chart for explaining the operation;

DESCRIPTION OF THE PREFERRED EMBODIMENTS

In an attempt to solve the problems mentioned above, an important feature of the semiconductor memory device of the present invention resides in the provision of a precharge circuit capable of outputting, synchronously with an equalizing signal, a medium-level voltage which is intermediate between high and low levels of a main data line, wherein the output of such precharge circuit is connected in parallel to the main data line. According to the semiconductor memory device where the precharge circuit is connected in parallel to the memory cell main data line, the precharge circuit increases the data-signal read speed with equalization but causes no delay in the signal because of its non-existence in the data signal transmission path. Consequently, reading the data signal can be accelerated effectively to achieve sufficient rapidity.

Furthermore, since the precharge circuit is driven in response to an equalizing signal and performs its operation during the equalization, there is no necessity of generating any particular pulse for such operation. Therefore, mere addition of the precharge circuit meets the requirements, and any particular circuit for generating a pulse to drive the precharge circuit is not needed to eventually avert undesired complication of the circuit configuration in the memory device.

Hereinafter the semiconductor memory device of the present invention will be described in detail with reference to preferred embodiments thereof shown in the accompanying drawings.

Figure 1:
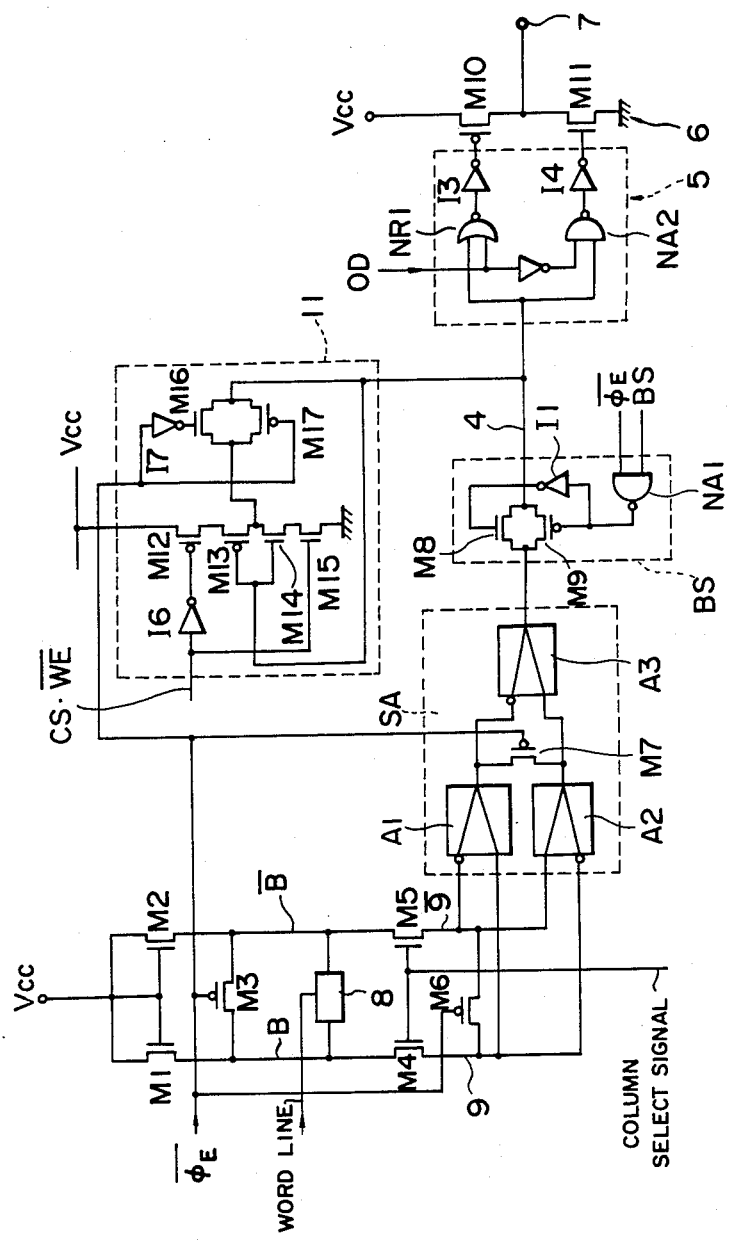

FIG. 1 is a circuit diagram of an exemplary embodiment representing the memory device of the invention.

Figure 5:
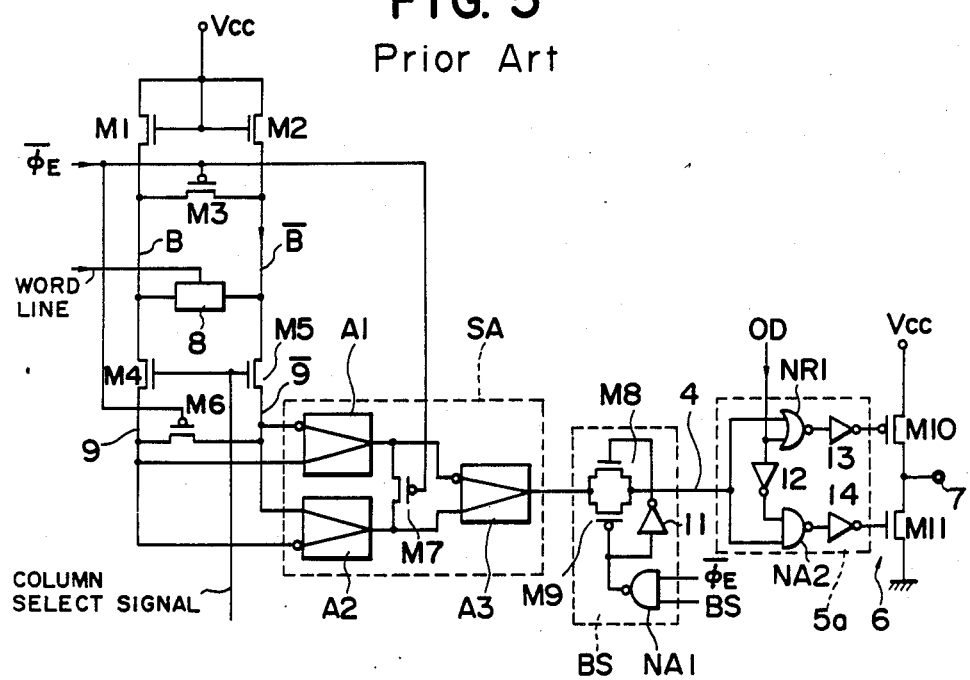
FIG. 5 is a circuit diagram of a first conventional example.

In comparison with the aforementioned memory device of FIG. 5, this memory device has a first difference in the provision of a precharge circuit and a second difference in the point that logical threshold voltages of a NOR circuit NR1 and an NAND circuit NA2 in a data hold circuit 5 are set to be mutually different. However, the two devices have a common configuration with respect to the other points. Since such common points have already been described above, a repeated explanation is omitted here, and a detailed description will be given below merely on the differences alone.

Denoted by 11 in FIG. 1 is a precharge circuit which comprises inverters I6, I7 and MOS FETs M12 through M17. The MOS FET M12 is a P-channel FET which is supplied, at its gate, with an output signal of the inverter I6 for inverting a signal CS·$\overline{WE}$ which is the logical product of a chip select signal CS and an inverter signal $\overline{WE}$ of a write enable signal WE. The drain of the MOS FET M12 is connected to the power supply terminal (+Vcc), and the source thereof is connected to the drain of the P-channel MOS FET M13. Meanwhile, the source of the MOS FET M13 is connected to the source of the N-channel MOS FET M14, and the gate thereof is connected to the gate of the MOS FET M14. The drain of the MOS FET M14 is connected to the source of the N-channel MOS FET M15, whose drain is grounded. And the MOS FET M15 is supplied with the aforesaid signal CS·$\overline{WE}$ at its gate.

The MOS FETs M12–M15 function as a CMOS inverter driven when the signal CS·$\overline{WE}$ is "high", and the input and output thereof are connected via a switch circuit which consists of a parallel connection of the N-channel MOS FET M16 and the P-channel MOS FET M17, in such a manner that a half voltage of the supply voltage Vcc is outputted when the switch circuit is turned on. The switch circuit consisting of the MOS FETs M16 and M17 is controlled by an equalizing signal $\overline{\phi E}$ and is turned on when this signal $\overline{\phi E}$ is "low", i.e. during the equalization. And the output terminal of the switch circuit is connected to the main data line 4.

In response to the equalizing signal $\overline{\phi E}$, the precharge circuit 11 functions to precharge the memory cell main data line 4 to a potential (2.5V) which is one half of the supply voltage Vcc (5V).

Denoted by 5 is a data hold circuit which is substantially the same in configuration as the output buffer control circuit 5a in the first conventional memory device of FIG. 5, but a mere difference resides in the point that the logical threshold voltages of the NOR circuit NR1 and the NAND circuit NA2 are set to be mutually different, unlike the output buffer control circuit 5a. More specifically, the NOR circuit NR1 in the data hold circuit 5 has a threshold voltage of 2V, while the NAND circuit NA2 has a threshold voltage of 3V. The reason for selecting such mutually different logical threshold voltages is grounded on the fact that, during the precharging operation, the data hold circuit 5 is rendered capable of producing an output signal to turn off both the MOS FETs M10 and M11 constituting the output buffer circuit 6. If the logical threshold voltages of both the NOR circuit NR1 and the NAND circuit NA2 in the data hold circuit 5 are set to 2.5V, then the main data line 4 is precharged to a potential around 2.5V, so that the output signal level of the data hold circuit 5 and hence that of the output buffer circuit 6 are varied by the presence of merely slight noise, whereby the level of the output terminal 7 is rendered extremely unstable. This phenomenon is undesired since it induces unnecessary anxiety to the user. In view of the circumstances mentioned, the threshold voltage of the NOR circuit NR1 is set to 2V while that of the NAND circuit NA2 is set to 3V as described, so that when the level of the precharged main data line 4 has reached 2.5V or so, the output of the NOR circuit NR1 is turned to "low" while that of the NAND circuit NA2 is turned to "high", whereby the P-channel MOS FET M10 and the N-channel MOS FET M11 in the output buffer circuit 6 are both turned off. Thus, if the MOS FETs M10 and M11 are so arranged as to be turned off during the precharge period, the data signal anterior to a transition is held to consequently stabilize the output level since the capacity of the load connected to the output terminal 7 of the memory device is relatively large, such as 30 pF. Therefore, with regard to the performance of the memory device, the user is kept free from any anxiety that may otherwise be caused by the output level variation during the precharge period.

Figure 2:
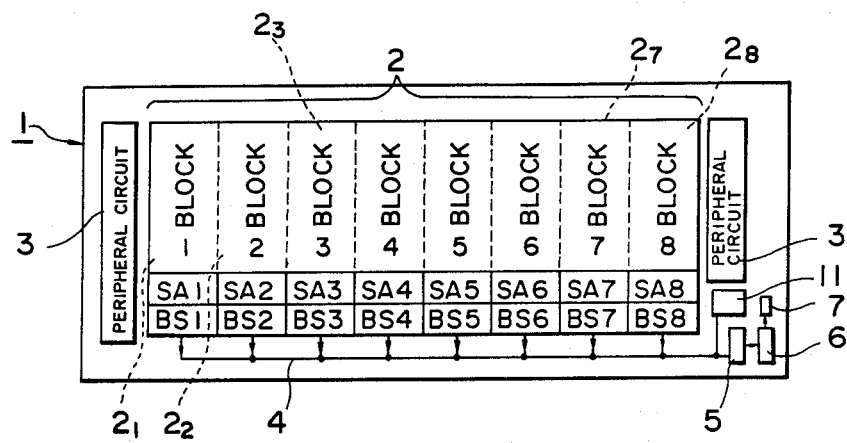

FIG. 2 is a layout diagram of the memory device. The difference between this diagram and the aforementioned layout diagram of FIG. 5 resides in the existence of the precharge circuit 11.

Figure 3:
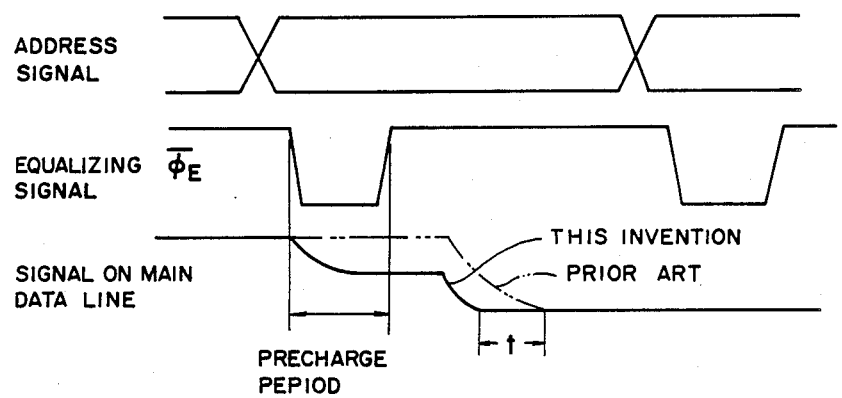
Figure 4:
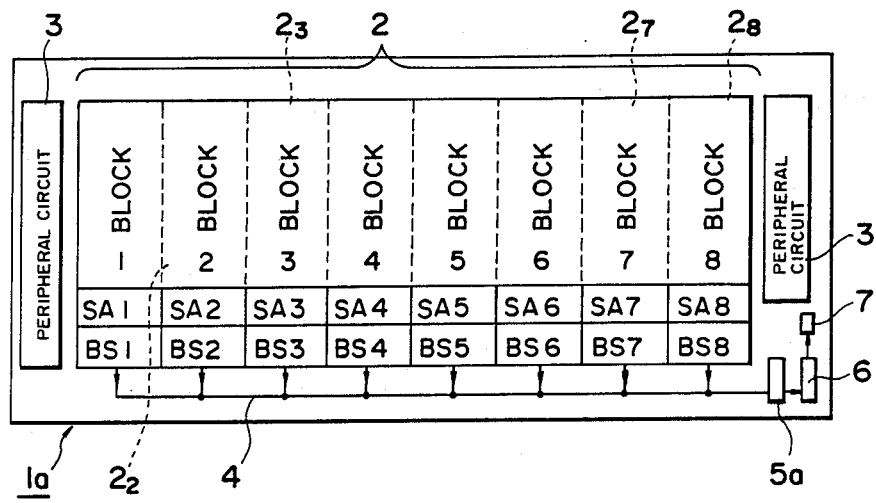
FIG. 4 is a layout diagram of a known memory device for explanation of the background art.

FIG. 3 is a timing chart showing the operation performed when the level of the main data line 4 is turned from "high" to "low" due to an address transition.

An address transition is detected from a change of the address signal, so that an equalizing signal $\overline{\phi E}$ having a certain pulse duration is generated in response to such address transition. Then the memory cell main data line 4 having a "high" level of +5V is precharged to a medium potential of +2.5V by the precharge circuit 11. And after fall of the equalizing signal $\overline{\phi E}$, the level of the main data line 4 is changed from the medium potential to another level ("high" level in this case) corresponding to the content of the data signal newly read out. In the memory device of FIG. 5 where no precharge is executed as shown by a two-dot chain line, the level of the former data signal is changed to the level corresponding to the content of the data signal newly read out. In comparison with the above, the data signal transition performed with precharge is accelerated from the time t to consequently enhance the rapidity.

Figure 6A:
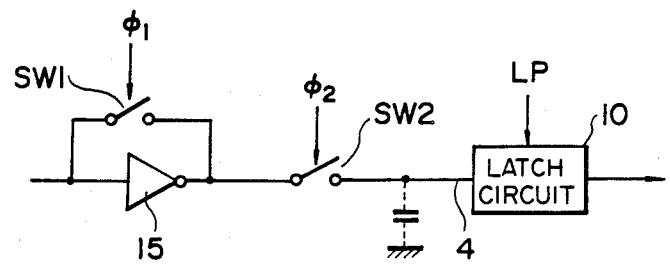
FIG. 6 (A) and (B) show a second conventional example, in which (A) is a circuit diagram of a precharge circuit, and (B) is a timing chart.
Figure 6B:
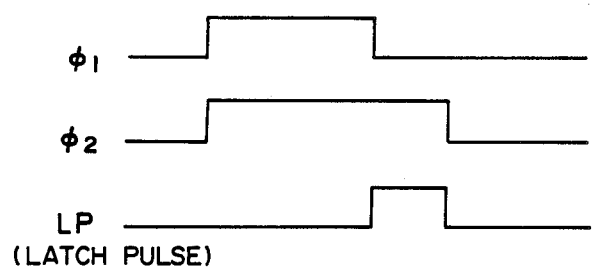

Although precharge is possible also by another conventional precharge circuit of the configuration shown in FIG. 6 (A), this precharge circuit is inserted in the data signal transmission path, so that the data signal is passed through many stages since it is transmitted to the output side via the inverter I5, the switch circuit SW2 and the latch circuit 10 of the precharge circuit. Consequently, it is natural that a delay is caused in the data signal every time the data signal is passed through each stage of the circuit. Thus, even though the read speed can be increased by such precharge, the concomitant delay is unavoidable, so that there is eventually failure in attaining effective enhancement of the rapidity.

In contrast therewith, according to the memory device of the present invention, the output of the precharge circuit 11 is connected in parallel to the main data line and therefore the data signal is not passed through the precharge circuit 11. As a result, the precharge circuit 11 is kept free from becoming a factor to cause any delay of the data signal and serves solely to increase the read speed due to its precharge function. Thus, it becomes possible to achieve effective acceleration of the signal read speed in the memory device of the present invention.

In most of the conventional memory devices, a resistor is customarily connected to the data signal output terminal 7. In such circuit configuration, it is known that sufficient rapidity can be realized with alleviation of a rush current by temporarily inducing the MOS FETs of the output buffer circuit to have a high impedance during the equalization. However, it is generally difficult to exactly adjust such timing, and it has frequently occurred that inaccurate timing adjustment prolongs the access time. According to the memory device of the present invention, when the main data line is precharged by the precharge circuit, the two MOS FETs of the output buffer circuit are caused to have a high impedance automatically by the function of the data hold circuit 5 as mentioned previously. And in response to a new data signal inputted to the main data line, the state of the data hold circuit 5 is so changed as to correspond to such data signal, whereby the data signal is transmitted under the condition that one of the MOS FETs of the output buffer circuit 6 is held at a low impedance. Such operation is performed automatically without the necessity of any particular control signal. Therefore, the output buffer circuit can be driven by the data hold circuit quickly with facility while no external control signal is required.

As described hereinabove, in the semiconductor memory device of the present invention where a group of multiple memory cells is divided into a plurality of memory cell blocks, the data stored in each memory cell of such blocks is read out through bit lines and local data lines, and the output of each memory cell block is connected to a main data line. And the feature of the present invention resides in the provision of a precharge circuit which generates, synchronously with an equalizing signal, a medium-level voltage which is intermediate between a high level and a low level of the main data line, wherein the output terminal of the precharge circuit is connected in parallel to the main data line.

Therefore, according to the memory device of the present invention where the precharge circuit is connected in parallel to the main data line, the precharge circuit is capable of accelerating the data signal read speed with equalization while being kept out of the data signal transmission path to eventually avert any delay of the signal, hence accomplishing effective enhancement of the rapidity in reading out the data signal.

Furthermore, since the precharge circuit performs its operation during the equalization in response to an equalizing signal, there is no necessity of generating any particular pulse for such operation. Consequently, the requirement is mere addition of the precharge circuit to execute such precharging operation while no particular circuit is needed to generate a pulse for driving the precharge circuit, hence averting complication relative to the circuit configuration of the memory device.

It will be apparent that various modifications and/or additions may be made in the apparatus of the invention without departing from the essential feature of novelty involved, which are intended to be defined and secured by the appended claims.

What is claimed is:

1. A semiconductor memory device comprising:
   a plurality of memory cell blocks;
   each of said memory cell blocks having a plurality of memory cells, bit lines, and local data lines for reading out data stored in each of said memory cells;
   a main data line connected to said local data lines; and
   a precharge circuit connected to said main data line and not in series with the connection between said local data lines and said main data line, said precharge circuit serving to generate, immediately before producing a reading output, a medium-level voltage intermediate between and high and low levels of said main data line.

2. A device according to claim 1, wherein said precharge circuit comprises an inverter and a switch interposed between the input and output of said inverter.

3. A device according to claim 1, including an equalizing circuit connected to said local pair of data lines and driven by an equalizating signal appearing synchronously with said medium-level voltage.

4. A semiconductor memory device comprising:
   a plurality of memory cell blocks, each consisting of a plurality of cells, a pair of bit lines connected to said memory cells, and means for connecting a pair of local data lines to said bit lines, and a differential amplifier connected to said local data lines;
   a main data line connected to the output of the differential amplifier in each memory cell block; and
   a precharge circuit connected in parallel to said main data line and serving to generate, immediately before producing a reading output, a medium-level voltage intermediate between high and low levels of said main data line.

5. A device according to claim 4, including an equalizing circuit connected to said pair of bit lines, said equalizing circuit being driven with an equalizing signal synchronously with production of said medium-level voltage.

6. A device according to claim 4, including an equalizing circuit driven synchronously with an equalizing signal, said equalizing circuit being connected to said pair of local data lines.

7. A device according to claim 1 or 4, wherein said memory cells are static memories.

8. A device according to claim 1 or 4, wherein said main data line is connected to an output terminal via a data hold circuit and an output buffer circuit.

9. A device according to claim 1 or 4, wherein said memory cell blocks comprise a plurality of memory cells arrayed in rows and columns, each of said rows having a word line connected to said memory cells, and each of said columns having a pair of said bit lines connected to said memory cells, and wherein said memory cells are asymmetrically arrayed with more memory cells disposed in the direction of said word lines than in the direction of said bit lines.

* * * * *